United States Patent
Kawamura et al.

(12) 
(10) Patent No.: US 7,666,320 B2
(45) Date of Patent: Feb. 23, 2010

(54) MANUFACTURING METHOD OF PRINTED WIRING BOARD AS WELL AS COPPER-CLAD LAMINATE AND TREATMENT SOLUTIONS USED THEREFOR

(75) Inventors: Toshinori Kawamura, Hitachi (JP); Haruo Akahoshi, Hitachi (JP); Kunio Arai, Ebina (JP)

(73) Assignee: Hitachi Via Mechanics, Ltd., Kanagawa (JP)

( * ) Notice: Subject to any disclaimer, the term of this patent is extended or adjusted under 35 U.S.C. 154(b) by 0 days.

(21) Appl. No.: 11/443,013

(22) Filed: May 31, 2006

(65) Prior Publication Data
US 2006/0270232 A1 Nov. 30, 2006

(30) Foreign Application Priority Data
May 31, 2005 (JP) ............................. 2005-159740
Nov. 7, 2005 (JP) ............................. 2005-322331

(51) Int. Cl.
*B23K 26/00* (2006.01)
*H05K 3/00* (2006.01)

(52) U.S. Cl. ............................. 216/13; 216/17; 216/18; 216/52; 216/83; 216/96; 216/97; 216/100; 216/105; 216/106; 216/108; 219/121.69; 134/2; 134/26; 134/27; 134/28

(58) Field of Classification Search .................... 216/17
See application file for complete search history.

(56) References Cited

U.S. PATENT DOCUMENTS

| | | | |
|---|---|---|---|
| 4,732,649 A * | 3/1988 | Larson et al. ................. 216/18 |
| 5,501,350 A * | 3/1996 | Yoshida et al. ............... 216/20 |
| 5,615,387 A * | 3/1997 | Crockett et al. .............. 29/847 |
| 6,346,678 B1 * | 2/2002 | Kono et al. ................... 174/255 |
| 6,632,344 B1 * | 10/2003 | Goldberg et al. ............. 205/159 |
| 6,708,404 B1 * | 3/2004 | Gaku et al. ................... 29/852 |
| 6,716,572 B2 * | 4/2004 | Yamamoto et al. .......... 430/318 |
| 6,830,627 B1 * | 12/2004 | Covert et al. ................. 134/3 |
| 2003/0141198 A1 * | 7/2003 | De Boer et al. ............. 205/475 |
| 2004/0091688 A1 * | 5/2004 | Gaku et al. ................... 428/209 |
| 2006/0172533 A1 * | 8/2006 | Sun et al. ..................... 438/675 |
| 2007/0163887 A1 * | 7/2007 | Hofmann ..................... 205/80 |
| 2008/0289176 A1 * | 11/2008 | En et al. ....................... 29/846 |

FOREIGN PATENT DOCUMENTS

JP 61099596 A * 5/1986

* cited by examiner

*Primary Examiner*—Anita K Alanko
(74) *Attorney, Agent, or Firm*—Wenderoth Lind & Ponack, LLP.

(57) ABSTRACT

There is provided a method for removing molten and scattered Cu and overhang that are generated around a via opening during laser machining in a direct laser via forming method of directly machining an outer-layer copper foil. In a manufacturing method of a printed wiring board of machining the via by laser directly through the copper foil of a copper-clad laminate in which the copper foil is clad on a base material resin, a process for machining the via is carried out in a sequence of (a) a copper foil surface treatment step of forming an oxide film on the surface of said copper foil, (b) a laser via machining step, (c) an alkali treatment step and (d) a molten and scattered Cu etching step. It is desirable to carry out (e) a de-smearing treatment after the molten and scattered Cu etching.

7 Claims, 11 Drawing Sheets

COPPER FOIL SURFACE TREATMENT
(FORM OXIDE FILM)

LASER VIA MACHINING

ALKALI TREATMENT,
REMOVE SUBSTANCE ADHERING
ON VIA WALL

MOLTEN AND SCATTERED Cu ETCHING
TREATMENT
REMOVE MOLTEN AND SCATTERED Cu
REMOVE OVERHANG

DE-SMEARING TREATMENT
REMOVE RESIDUAL RESIN
AT BOTTOM OF VIA AND
REMOVE OXIDE

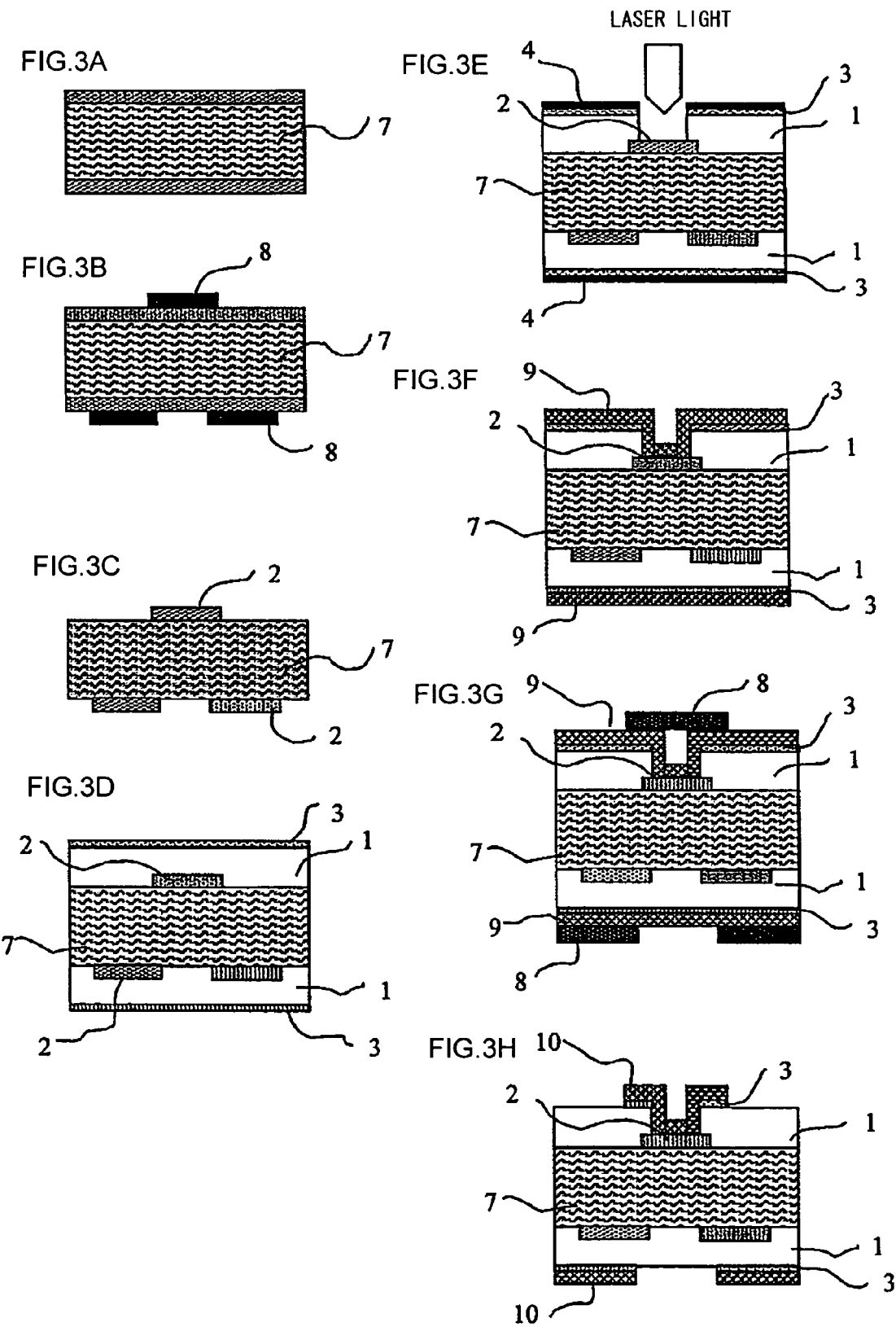

FIG.4

| | MOLTEN AND SCATTERED Cu/OVERHANG | ETCHING WIDTH OF OUTER-LAYER COPPER FOIL | REDUCED WIDTH OF THICKNESS OF OUTER-LAYER COPPER FOIL | REDUCED WIDTH OF THICKNESS OF INNER-LAYER WIRE |
|---|---|---|---|---|
| EMBODIMENT 1 | nil | 13 μm | 0.5 μm | 0.5 μm |
| EMBODIMENT 2 | nil | 13 μm | 0.6 μm | 0.4 μm |
| EMBODIMENT 3 | nil | 17 μm | 0.8 μm | 0.5 μm |
| EMBODIMENT 4 | nil | 18 μm | 0.5 μm | 0.5 μm |
| EMBODIMENT 5 | nil | 14 μm | 0.6 μm | 0.5 μm |
| EMBODIMENT 6 | nil | 16 μm | 0.8 μm | 0.5 μm |
| EMBODIMENT 7 | nil | 19 μm | 0.9 μm | 0.5 μm |
| EMBODIMENT 8 | nil | 16 μm | 0.6 μm | 0.4 μm |
| EMBODIMENT 9 | nil | 14 μm | 0.5 μm | 0.5 μm |
| EMBODIMENT 10 | nil | 12 μm | 0.5 μm | 0.4 μm |
| EMBODIMENT 11 | nil | 16 μm | 0.6 μm | 0.5 μm |
| COMPARATIVE EXAMPLE 1 | exist | - | 0.5 μm | 0.5 μm |
| COMPARATIVE EXAMPLE 2 | - | - | - | - |
| COMPARATIVE EXAMPLE 3 | nil | 3 μm | 2.5 μm | 2.1 μm |

FIG.6

| | ALKALI TREATMENT | | MOLTEN AND SCATTERED Cu ETCHING TREATMENT | |
|---|---|---|---|---|
| | COMPOSITION, CONCENTRATION | TREATMENT CONDITION | COMPOSITION, CONCENTRATION | TREATMENT CONDITION |
| EMBODIMENT 1 | NaOH:50g/l | 50°C/3min | AMMONIUM PERSULFATE:200g/l SULFURIC ACID:5ml/l | 30°C/3min |
| EMBODIMENT 2 | NaOH:10g/l | 50°C/15min | AMMONIUM PERSULFATE:200g/l SULFURIC ACID:5ml/l | 30°C/3min |
| EMBODIMENT 3 | NaOH:100g/l | 50°C/2min | AMMONIUM PERSULFATE:200g/l SULFURIC ACID:5ml/l | 30°C/3min |
| EMBODIMENT 4 | NaOH:50g/l | 30°C/6min | AMMONIUM PERSULFATE:200g/l SULFURIC ACID:5ml/l | 30°C/3min |
| EMBODIMENT 5 | NaOH:50g/l | 80°C/2min | AMMONIUM PERSULFATE:200g/l SULFURIC ACID:5ml/l | 30°C/3min |
| EMBODIMENT 6 | KOH:50g/l | 50°C/3min | AMMONIUM PERSULFATE:200g/l SULFURIC ACID:5ml/l | 30°C/3min |
| EMBODIMENT 7 | NaOH:50g/l | 50°C/3min | FERRIC CHLORIDE:370g/l | 30°C/1min |
| EMBODIMENT 8 | NaOH:50g/l | 50°C/3min | AMMONIUM PERSULFATE:200g/l | 30°C/3min |
| EMBODIMENT 9 | NaOH:50g/l | 50°C/3min | SODIUM PERSULFATE:150g/l | 30°C/3min |
| EMBODIMENT 10 | NaOH:50g/l | 50°C/3min | 25 % AQUEOUS AMMONIA:30% HYDROGEN PEROXIDE:0.3% | 30°C/6min |
| EMBODIMENT 11 | NaOH:50g/l | 50°C/3min | AMMONIUM COPPER CHLORIDE:100g/l 25 % AQUEOUS AMMONIA:20% | 30°C/2min |

FIG.8

| | SODIUM CHLORITE (g/l) | SODIUM HYDROXIDE (g/l) |
|---|---|---|
| EMBODIMENT 12 | 120 | 80 |
| EMBODIMENT 13 | 120 | 100 |
| EMBODIMENT 14 | 120 | 60 |
| EMBODIMENT 15 | 100 | 100 |
| EMBODIMENT 16 | 100 | 80 |
| EMBODIMENT 17 | 100 | 60 |
| EMBODIMENT 18 | 140 | 100 |
| EMBODIMENT 19 | 140 | 80 |
| EMBODIMENT 20 | 140 | 60 |
| EMBODIMENT 21 | 160 | 100 |
| EMBODIMENT 22 | 160 | 80 |
| EMBODIMENT 23 | 160 | 60 |
| COMPARATIVE EXAMPLE 4 | 90 | 15 |
| COMPARATIVE EXAMPLE 5 | — | — |

FIG.9

| | BORE 50 μm LASER ENERGY (mJ) | BORE 80 μm LASER ENERGY (mJ) | SURFACE REFLECTANCE (%) | THICKNESS OF COPPER OXIDE FILM |
|---|---|---|---|---|
| EMBODIMENT 12 | 4 | 10 | 33 | 1.4 |
| EMBODIMENT 13 | 8 | 14 | 53 | 1.9 |
| EMBODIMENT 14 | 5 | 12 | 44 | 1.2 |
| EMBODIMENT 15 | 10 | 15 | 56 | 1.7 |
| EMBODIMENT 16 | 6 | 14 | 40 | 1.6 |
| EMBODIMENT 17 | 12 | 15 | 81 | 1.3 |
| EMBODIMENT 18 | 11 | 16 | 58 | 1.8 |
| EMBODIMENT 19 | 5 | 11 | 47 | 1.5 |
| EMBODIMENT 20 | 12 | 17 | 84 | 1.1 |
| EMBODIMENT 21 | 9 | 13 | 52 | 1.9 |
| EMBODIMENT 22 | 12 | 18 | 59 | 1.5 |
| EMBODIMENT 23 | 14 | 18 | 63 | 1.3 |
| COMPARATIVE EXAMPLE 4 | 15 | 18 | 98 | 0.5 |
| COMPARATIVE EXAMPLE 5 | 12 | 14 | 50 | 0.02 |

FIG.10

|  | TARGET 50 μm | TARGET 80 μm |
| --- | --- | --- |
|  | BORE OF COPPER FOIL LAYER/BORE OF INSULATING LAYER ||
| EMBODIMENT 12 | 0.84 | 0.77 |
| COMPARATIVE EXAMPLE 4 | 0.5 | 0.53 |

# MANUFACTURING METHOD OF PRINTED WIRING BOARD AS WELL AS COPPER-CLAD LAMINATE AND TREATMENT SOLUTIONS USED THEREFOR

BACKGROUND OF THE INVENTION

1. Field of the Invention

The present invention relates to a method for manufacturing a printed wiring board by mean of laser via machining as well as to a copper-clad laminate and treatment solutions used therefor.

2. Description of Related Art

With miniaturization and lightening of electronic devices, a high density printed wiring boards is being required and highly multi-layered printed wiring boards are being developed lately. It is then necessary to assure conduction between wiring layers on which circuits are formed through an intermediary of an insulating layer in implementing the multi-layered printed wiring board and hence inter-layer connection has become an important element in the technology for manufacturing such multi-layered printed wiring board.

As types of inter-layer connection of wiring layers, there is a through hole as well as a blind via hole and an interstitial via hole, i.e., non-through holes. While methods for forming such holes include a drill machining method, a laser machining method and others, the laser machining method has become the main stream from the aspects of downsizing of the machined hole and of high machining speed. Above all, $CO_2$ lasers having high laser energy have spread most. However, it has been difficult to machine such holes because laser light is reflected on a surface of copper foil in a wavelength range of the $CO_2$ laser. Then, a large window method of machining holes after etching and removing only copper foil around a hole to be formed in advance has been adopted.

However, because the large window method requires a step of patterning the copper foil as well as a copper foil etching diameter that is twice the size of a diameter of laser for correction of misalignment of laser machined hole, it has been difficult to design fine wiring. Then, there has been discussed a direct via machining technology of directly machining copper foil and an insulating layer by laser in the same time. The direct via machining method allows machining of the copper foil by roughening the surface of the copper foil to increase its laser light absorptance. The process for roughening the surface of the copper foil includes a blackening treatment of forming a copper oxide film of needle-like crystal, a treatment of directly roughening copper by grain-boundary etching of copper, and others.

The following are documents related to such technologies:
Japanese Patent Laid-Open No. 2002-217551,
Japanese Patent Laid-Open No. 2004-6611, and
Toshiki Hirogaki and four others, "Improvement of Quality of Hole in Cu Direct Machining by $CO_2$ Laser", the $14^{th}$ Micro-Electronics Symposium, October, 2004

When the direct via machining is carried out by using laser through a copper-clad laminate in which a roughening treatment has been implemented on the surface of copper foil, molten and scattered Cu that is caused by Cu melted by heat of the laser and that scatters and sticks convexly around a via opening is generated and a so-called overhang by which a bore of the outer-layer copper foil becomes smaller than a bore of an insulating layer is generated. FIGS. 1a and 1b are schematic drawings showing the molten and scattered Cu and overhang generated by performing the direct via machining through the copper-clad laminate, wherein FIG. 1a is a plan view (top view) and FIG. 1b is a section view along a line A-A in FIG. 1a. When laser light is irradiated to machine a via through the copper-clad laminate on which an outer-layer copper foil 3 is formed on an insulating layer 1 having an inner-layer wiring 2 and a copper oxide film 4 is formed on the surface thereof, the molten and scattered Cu and overhang 5 are generated around the opening. The molten and scattered Cu and overhang 5 must be removed because they lower adhesion of plating around the via and flatness in lamination in later steps. They may be removed by physical grinding by means of a buff or by chemical etching by means of a chemical agent. However, there has been problems that the outer-layer copper foil or inner-layer wiring is ground or etched, thus reducing a wiring thickness, by the treatment for removing the molten and scattered Cu and overhang.

Accordingly, it is an object of the invention to provide a direct via machining process as well as a copper-clad laminate and treatment solutions used therefor that allow the molten and scattered Cu and overhang to be removed without reducing the wiring thickness.

SUMMARY OF THE INVENTION

The present invention is characterized in that in a manufacturing method of a printed wiring board for machining a via by means of laser directly through a copper foil of a copper-clad laminate in which the copper foil is clad on a base material resin, molten and scattered Cu and overhang that are generated around a via opening of an outer-layer copper foil during laser machining are selectively removed. More specifically, a process for machining the via is carried out in a sequence of a copper foil surface treatment step of forming an oxide film on the surface of the copper foil, a laser via machining step, an alkali treatment step and a molten and scattered Cu etching step. Preferably, the alkali treatment step is carried out by a treatment solution containing sodium hydroxide or potassium hydroxide. Preferably, pH is 12 or more. Preferably, the molten and scattered Cu etching step is carried out by either one treatment solution among a treatment solution containing ammonium persulfate, a treatment solution containing sodium persulfate, a treatment solution containing ferric chloride, a treatment solution containing ammonia and hydrogen peroxide or a treatment solution containing ammonia and copper chloride.

In the copper foil treatment step, preferably copper oxide whose surface reflectance to infrared light whose wavelength is in a range of 9.3 to 10.6 μm is 30 to 80% and whose thickness is 1.0 to 2.0 μm is formed on the surface of the outer-layer copper foil. It is also preferable to treat the surface of the outer-layer copper foil by a surface treatment solution containing sodium chlorite of 100 to 160 (g/l) of concentration and sodium hydroxide of 60 to 100 (g/l) of concentration in the copper foil surface treatment.

The copper foil surface treatment for forming a copper oxide whose surface reflectance to infrared light whose wavelength is in a range of 9.3 to 10.6 μm is 30 to 80% and whose thickness is 1.0 to 2.0 μm is carried out on the surface of the outer-layer copper foil of the copper-clad laminate for use in the manufacturing method of the printed wiring board before the laser machining of forming the via by means of laser light whose wavelength is in a range of 9.3 to 10.6 μm. The surface treatment solution used in the copper foil surface treatment contains sodium chlorite whose concentration is 100 to 160 g/l and sodium hydroxide whose concentration is 60 to 100 g/l.

The molten and scattered Cu and overhang that are generated in the laser machining may be selectively removed and the shape of the via and accuracy of dimension of wiring of the printed wiring board may be improved through the implementation of the direct via machining process of the invention. Still more, the copper foil surface treatment allows the copper foil to be drilled at low energy in the laser machining.

Additional objects and advantages of the invention will be apparent from the following detailed description of a preferred embodiment thereof, which are best understood with reference to the accompanying drawings.

BRIEF DESCRIPTION OF THE DRAWINGS

FIGS. 3A through 3H are schematic drawings showing a printed wiring board manufacturing process.

FIG. 4 is a table showing states in which the molten and scattered Cu is removed, a rate of decrement of thickness of wires and result of evaluation of misalignment.

FIG. 6 is a table showing composition, concentration and treatment conditions of an alkali treatment and a molten and scattered Cu etching process.

FIG. 8 is a table showing compositional conditions of a copper foil surface treatment solution of the embodiments of the invention and of comparative examples thereof.

FIG. 9 is a table showing evaluation of laser via machinability and measured results of reflectance and thickness of the copper oxide film of the embodiments of the invention and of comparative examples thereof.

FIG. 10 is a table showing results of evaluation of overhang of the embodiments of the invention and of comparative examples thereof.

DETAILED DESCRIPTION OF THE INVENTION

Figure 1A:
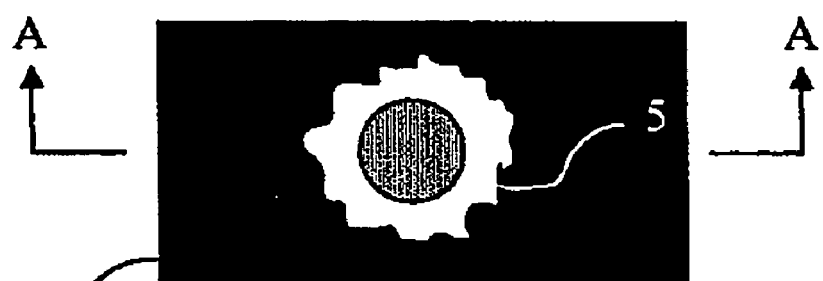
FIGS. 1A and 1B are schematic drawings showing molten and scattered Cu and overhang.
Figure 1B:
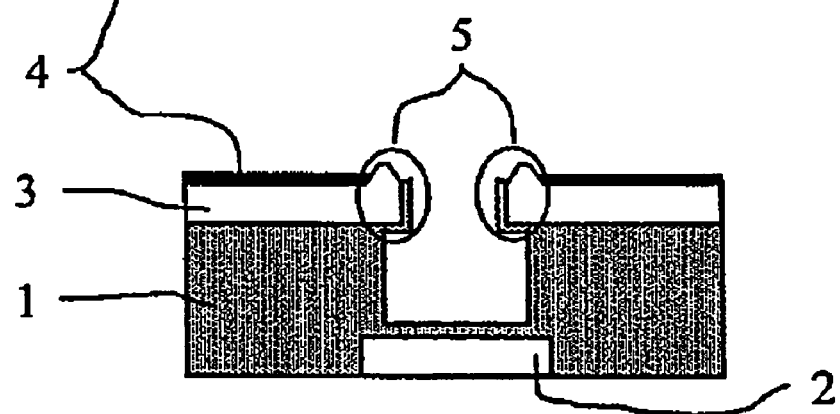

Modes for carrying out the invention will be explained below with reference to the accompanying drawings.

As shown in FIG. 2, a direct via machining process in a printed wiring board manufacturing method of the present embodiment includes a) a copper foil surface treatment (formation of an oxide film), b) a laser via machining, c) an alkali treatment and d) molten and scattered Cu etching. It is important to form a copper oxide film on the surface of the copper foil and to keep the copper oxide film until when the molten and scattered Cu and overhang are removed in order to selectively remove the molten and scattered Cu and overhang. Still more, adherent substance derived from the insulating layer must be removed by the alkali treatment before completely removing the molten and scattered Cu. It is also desirable to carry out a de-smearing treatment after the molten and scattered Cu etching as necessary.

In the process for forming the oxide film on the surface of the copper foil, the copper oxide film of 0.6 µm or more in thickness is formed on the surface of the outer-layer copper foil. When the thickness of the copper oxide film is 0.5 µm or less, its etching resistance drops and the selectivity of the molten and scattered Cu and the copper oxide film also drops. Then, as a method for forming the copper oxide film, a blackening treatment that achieves both roughening of the surface of the copper foil and the formation of the copper oxide in the same time was used in the invention. A blackening treatment solution used in the invention is not specifically limited and a commercially sold treatment solution was used.

Although a wavelength range of ultra-violet and infrared light of the laser used in the laser via machining is not also specifically limited, $CO_2$ laser whose wavelength is 9.3 to 10.6 µm was used in the embodiments described below.

The alkali treatment is a treatment of removing the adherent substance derived from the insulating layer and generated during laser machining. It becomes unable to completely remove the molten and scattered Cu and overhang if the adherent substance derived from the insulating layer adheres on the surface of the molten and scattered Cu and overhang during laser machining and protects the molten and scattered Cu and overhang during etching. Therefore, it is necessary to carry out the alkali treatment before the etching to remove the adherent substance derived from the insulating layer and adhered on the surface of the molten and scattered Cu and overhang. Residue of the insulating layer at the bottom of the via is thicker than the adherent substance of the molten and scattered Cu and the composition of the residue of the insulating layer at the bottom of the via is different from that of the adherent substance of the molten and scattered Cu, so that the residue of the insulating layer at the bottom of the via is barely removed by the alkali treatment described above and only the adherent substance derived from the insulating layer and generated on the wall face of the via may be selectively removed. The alkali treatment solution of this embodiment is an alkali aqueous solution containing sodium hydroxide or potassium hydroxide of pH 12 or more.

The molten and scattered Cu etching is a treatment for selectively removing the molten and scattered Cu and overhang. Desirably, its treatment solution is what less dissolves the copper oxide film and what more dissolves the molten and scattered Cu. The molten and scattered Cu etching solution of the present embodiment is a ferric chloride solution and sodium persulfate and ammonia Cu etching solution.

The de-smearing treatment is a treatment for removing resin residue at the bottom of the via that could not be fully removed during the laser machining. The treatment step is carried out through swelling, oxidation and neutralization. The de-smearing treatment solution may be a commercially sold treatment solution.

The printed wiring board of the present embodiment is not specifically limited and is a generally known rigid or flexible circuit board having copper foil on both sides or on one side of resin or that containing glass cloth.

First Embodiment

FIGS. 3A through 3H are schematic drawings showing a printed wiring board manufacturing process of the invention, wherein FIGS. 3A through 3D show an inner-layer circuit forming process and FIGS. 3E through 3H shows an outer-layer circuit forming process.

FIG. 3A is a schematic drawing of an inner-layer base material 7. In the present embodiment, copper-clad laminate MCL-E679 manufactured by Hitachi Chemical Co., Ltd. was used as the inner-layer base material. Inner-layer circuit resist patterns were formed on the copper foil as shown in FIG. 3B and then Cu was removed by etching while using the resists as masks for forming the inner-layer circuits 2 as shown in FIG. 3C. Next, polyimide sheets whose one side is attached with copper foil are laminated by press on the inner-layer base material 7 on which the inner-layer circuit 2 have been formed to fabricate a four-layer copper-clad laminate as shown in FIG. 3D. A thickness of the polyimide layer (insulating layer) 1 was 30 μm and that of outer-layer copper foil was 6 μm. Next, a direct via machining was carried out as shown in FIG. 3E.

The direct via machining process shown in FIG. 3E will be explained with reference to FIG. 2.

Figure 2A:
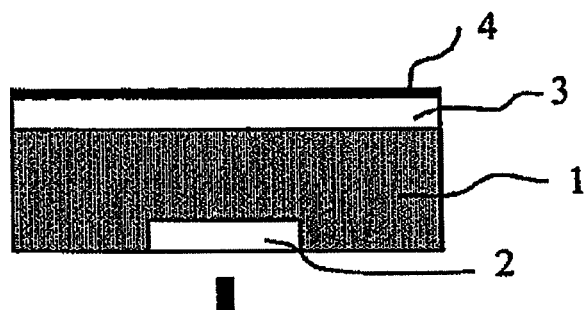
FIGS. 2A through 2E are schematic drawings showing a direct via machining process.

1. Copper Foil Surface Treatment (Oxidation Treatment) (FIG. 2A)

At first, the blackening treatment was carried out in order to roughen the surface of the outer-layer copper foil 3 of the copper-clad laminate described above and to form a copper oxide film 4. A blackening treatment solution used was Probond 80 manufactured by ROHM and HAAS Co. Treatment conditions were 80° C. of solution temperature and five minutes of treatment time. A thickness of the formed copper oxide film was 0.8 μm.

Figure 2B:
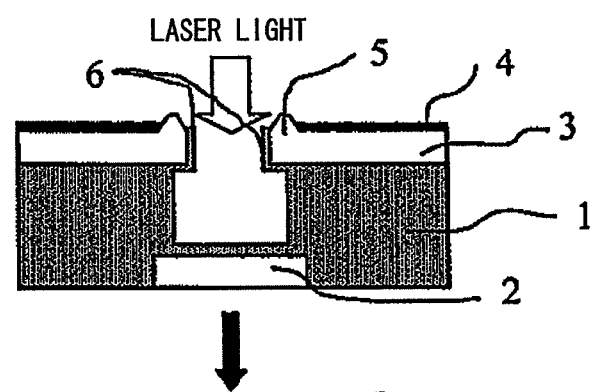

2. Laser Via Machining (FIG. 2B)

Next, blind via machining was carried out by $CO_2$ laser on the copper-clad laminate which has been blackened. Laser energy was 10 mJ and a via diameter was 100 μm. At this time, molten and scattered Cu and overhang 5 were formed around an opening of the via and the adherent substance derived from the insulating layer was generated on a wall face of the via.

Figure 2C:
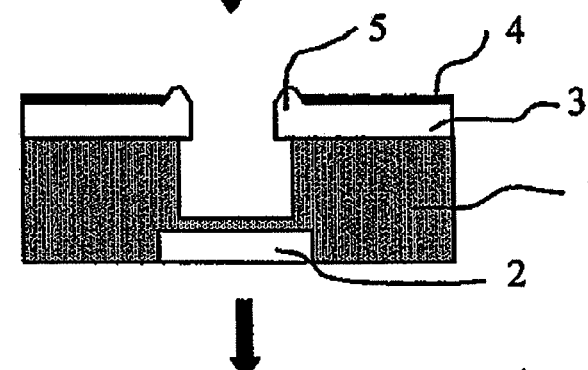

3. Alkali Treatment (FIG. 2C)

Next, the alkali treatment was carried out for the removal of the adherent substance 6 derived from the insulating layer and generated on the via wall face during the laser machining. The alkali treatment solution contained sodium hydroxide whose concentration was 50 g/l and the treatment was carried out under conditions of 50° C. of solution temperature and three minutes of treatment time.

Figure 2D:
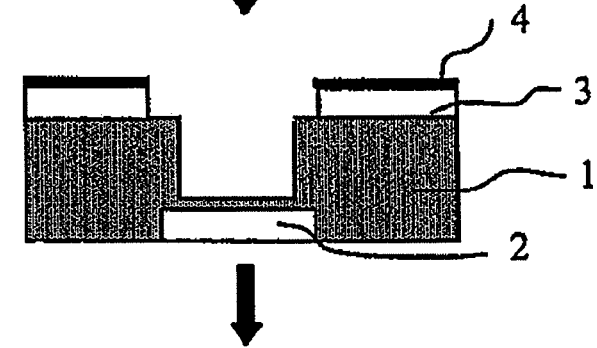

4. Molten and Scattered Cu Etching (FIG. 2D)

Next, the etching was carried out for the removal of the molten and scattered Cu and overhang 5. The etching solution contained ammonium persulfate whose concentration was 200 g/l and sulfuric acid whose concentration was 5 ml/l. The treatment was carried out under conditions of 30° C. of solution temperature and three minutes of treatment time.

Figure 2E:
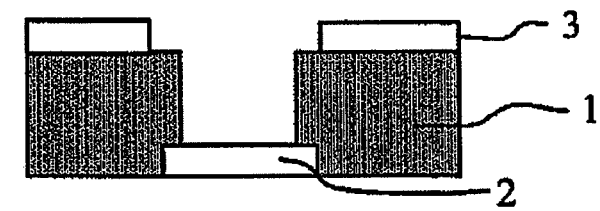

5. De-Smearing Treatment (FIG. 2E)

Next, the de-smearing treatment was carried out for the removal of resin residue at the bottom of the via and removal of the copper oxide film of the outer-layer copper foil. In the de-smearing treatment, a swelling solution used was Circuposit Holeprep 4125 manufactured by ROHM and HAAS Co. Its solution temperature was 70° C. and a treatment time was five minutes. An oxidation solution used was Circuposit MLB Promoter 213 manufactured by ROHM and HAAS Co. Its solution temperature was 80° C. and a treatment time was five minutes. A neutralizing solution used was Circuposit MLB Neutralizer 216-5 manufactured by ROHM and HAAS Co. Its solution temperature was 40° C. and a treatment time was five minutes.

After the direct via machining process described above, outer-layer circuits were formed as shown in FIGS. 3F through 3H. At first, 15 μm of copper plated film 9 was formed for the formation of inter-layer conduction of the machined blind via as shown in FIG. 3F. Then, an outer-layer circuit resist pattern 8 was formed on the copper plated film 9 as shown in FIG. 3G and etching was carried out by the ferric chloride solution to form the outer-layer circuit 10 and to fabricate the multi-layered printed wiring board as shown in FIG. 3H.

The section of the multi-layered printed wiring board fabricated as described above was observed for measurement of the state of removal of the molten and scattered Cu and overhang and of a reduced width of a thickness of the outer-layer copper foil and of the inner-layer wiring caused by the etching. The sample was taken after the de-smearing treatment after the laser via machining in the direct via machining process. FIG. 4 shows its result. FIG. 6 also shows each alkali treatment condition as the first embodiment.

Figure 5:
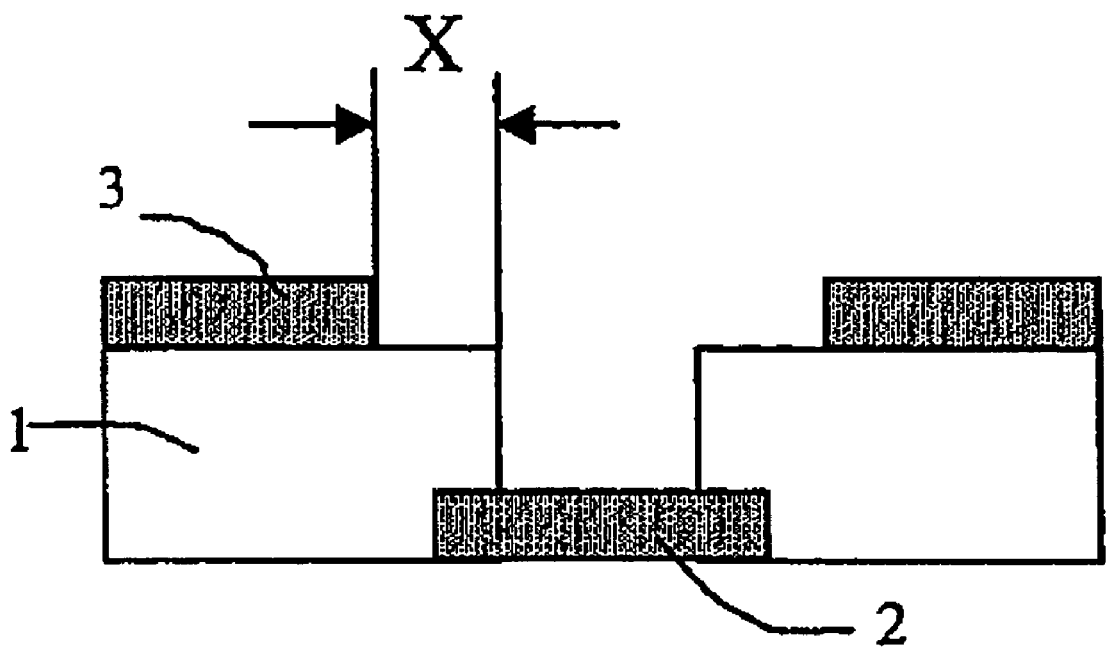
FIG. 5 is a schematic drawing showing a method for evaluating an etching width of an outer-layer copper foil.

In the result of the removal of the molten and scattered Cu and overhang, although the molten and scattered Cu and overhang had been generated on the outer-layer copper foil around the via after the laser machining, the outer-layer copper foil in a region where the molten and scattered Cu was generated around the via was all removed after the de-smearing treatment. Its appearance was the same with a shape obtained by etching the outer-layer copper foil by the large window method before laser machining and the outer-layer copper foil was all etched in the shape of a cylinder whose diameter is slightly larger than that of the machined via. Then, a distance from the edge of the via to the edge of the outer-layer copper foil was measured as an outer-layer copper foil etching width X as shown in FIG. 5. Its result was 13 μm. The smaller the outer-layer copper foil etching width, the smaller the diameter of land of the outer-layer circuit may be.

The thickness of the outer-layer copper foil decreased by 0.5 μm after the de-smearing treatment as compared to that after the laser via machining. The thickness of the inner-layer wiring decreased by 0.5 μm after the de-smearing treatment as compared to that after the laser via machining.

Thus the use of the direct via machining process of the present embodiment allows the removal of the molten and scattered Cu and overhang while scarcely decreasing the thickness of the inner-layer wiring and the outer-layer copper foil.

Second and Third Embodiments

The printed wiring board was fabricated in the same manner with the first embodiment while varying the concentration of sodium hydroxide of the alkali treatment solution (see FIG. 2C) in the direct via machining process in a range of 10 to 100 g/l. Then, the state of removal of the molten and scattered Cu and overhang and the etching width of the outer-layer copper foil were measured and the reduced width of the thickness of the outer-layer copper foil and the inner-layer wiring were evaluated. FIG. 4 shows its result. FIG. 6 shows each alkali treatment condition as the second and third embodiments.

After the dc-smearing treatment, the molten and scattered Cu and overhang were all removed in each embodiment and the result of measurement of the outer-layer copper foil etching width was 13 to 17 μm. In the evaluation of the reduced width of the thickness of the outer-layer copper foil, the thickness decreased by 0.6 to 0.8 μm after the de-smearing treatment as compared to that after the laser via machining. In the evaluation of the reduced width of the thickness of the inner-layer wiring, the thickness decreased by 0.4 to 0.5 μm after the de-smearing treatment as compared to that after the laser via machining.

Fourth and Fifth Embodiments

The printed wiring board was fabricated in the same manner with the first embodiment while varying the solution temperature of the alkali treatment (see FIG. 2C) in the direct via machining process in a range of 30 to 80° C. Then, the state of removal of the molten and scattered Cu and overhang and the etching width of the outer-layer copper foil were measured and the reduced width of the thickness of the outer-layer copper foil and the inner-layer wiring were evaluated. FIG. 4 shows its result. FIG. 6 shows each alkali treatment condition as the fourth and fifth embodiments.

After the de-smearing treatment, the molten and scattered Cu and overhang were all removed in each embodiment and the result of measurement of the outer-layer copper foil etching width was 14 to 18 μm. In the evaluation of the reduced width of the thickness of the outer-layer copper foil, the thickness decreased by 0.5 to 0.6 μm after the de-smearing treatment as compared to that after the laser via machining. In the evaluation of the reduced width of the thickness of the inner-layer wiring, the thickness decreased by 0.5 μm after the de-smearing treatment as compared to that after the laser via machining.

Sixth Embodiment

The printed wiring board was fabricated in the same manner with the first embodiment by changing the composition of the alkali treatment solution (see FIG. 2C) in the direct via machining process to potassium hydroxide. Then, the state of removal of the molten and scattered Cu and overhang and the etching width of the outer-layer copper foil were measured and the reduced width of the thickness of the outer-layer copper foil and the inner-layer wiring were evaluated. FIG. 4 shows its result. FIG. 6 shows the alkali treatment condition as the sixth embodiment.

After the de-smearing treatment, the molten and scattered Cu and overhang were all removed and the result of measurement of the outer-layer copper foil etching width was 16 μm. In the evaluation of the reduced width of the thickness of the outer-layer copper foil, the thickness decreased by 0.8 μm after the de-smearing treatment as compared to that after the laser via machining. In the evaluation of the reduced width of the thickness of the inner-layer wiring, the thickness decreased by 0.5 μm after the de-smearing treatment as compared to that after the laser via machining.

Seventh Through Eleventh Embodiments

The printed wiring board was fabricated in the same manner with the first embodiment while changing the composition of the molten and scattered Cu etching solution (see FIG. 2D) in the direct via machining process to ferric chloride, ammonium persulfate, sodium persulfate, ammonia/hydrogen peroxide and ammonia/copper chloride. Then, the state of removal of the molten and scattered Cu and overhang and the etching width of the outer-layer copper foil were measured and the reduced width of the thickness of the outer-layer copper foil and the inner-layer wiring were evaluated. FIG. 4 shows its result. FIG. 6 shows each molten and scattered Cu etching condition as the seventh through eleventh embodiments.

After the de-smearing treatment, the molten and scattered Cu and overhang were all removed in each embodiment and the result of measurement of the outer-layer copper foil etching width was 12 to 19 μm. In the evaluation of the reduced width of the thickness of the outer-layer copper foil, the thickness decreased by 0.5 to 0.9 μm after the de-smearing treatment as compared to that after the laser via machining. In the evaluation of the reduced width of the thickness of the inner-layer wiring, the thickness decreased by 0.4 to 0.5 μm after the de-smearing treatment as compared to that after the laser via machining.

It is apparent from the results of these first through eleventh embodiments that the molten and scattered Cu and overhang may be removed while keeping the reduced width of the thickness of the inner-layer wiring at 0.5 μm or less and that of the outer-layer copper foil at 1.0 μm or less by using the direct via machining process of the invention in the manufacturing method of the printed wiring board. Still more, the invention allows the multi-layered printed wiring board having high reliability in the inter-layer connection to be obtained because the shape of the laser via is improved.

First Comparative Example

A treatment was carried out under the same condition with the first embodiment except of the alkali treatment to fabricate the multi-layered printed wiring board for comparison.

1) Copper Foil Surface Oxidation Treatment:

The blackening treatment was carried out in the same manner with the first embodiment in order to roughen the outer-layer copper foil surface of the copper-clad laminate and to form the copper oxide film.

2) Laser Via Machining:

Next, the blind via machining was carried out on the copper-clad laminate on which the blackening treatment was carried out by the $CO_2$ laser in the same manner with the first embodiment.

3) Molten and Scattered Cu Etching Treatment:

Next, the etching was carried out in the same manner with the first embodiment in order to remove the molten and scattered Cu and overhang.

4) De-Smearing Treatment:

Next, the de-smearing treatment was carried out in the same manner with the first embodiment in order to remove resin residue at the bottom of the via.

A section of the fabricated printed wiring board was observed in the same manner with the first embodiment for the measurement of the state of removal of the molten and scattered Cu and overhang and of the etching width of the outer-layer copper foil and for the detection of the reduced width of the thickness of the outer-layer copper foil and the inner-layer wiring. The sample was taken after the de-smearing treatment after the laser via machining in the direct via machining process. FIG. 4 shows its result.

As the result of the removal of the molten and scattered Cu and overhang, the molten and scattered Cu and overhang remained after the de-smearing treatment. Supposedly, this happened because no alkali treatment was carried out, the adherent substance derived from the insulating layer left on the surface of the molten and scattered Cu and overhang during the laser machining and the molten and scattered Cu and overhang did not contact with the etching solution. In the evaluation of the reduced width of the thickness of the outer-layer copper foil, the thickness decreased by 0.5 μm after the de-smearing treatment as compared to that after the laser via machining. In the evaluation of the reduced width of the thickness of the inner-layer wiring, the thickness decreased by 0.5 μm after the de-smearing treatment as compared to that after the laser via machining.

Thus, the molten and scattered Cu and overhang cannot be completely removed without carrying out the alkali treatment before the molten and scattered Cu etching.

Second Comparative Example

The direct via machining process was carried out under the same condition with the first embodiment except of that cupric chloride solution was used as the molten and scattered Cu etching solution for comparison.

1) Copper Foil Surface Oxidation Treatment:

The blackening treatment was carried out in the same manner with the first embodiment in order to roughen the outer-layer copper foil surface of the copper-clad laminate and to form the copper oxide film.

2) Laser Via Machining:

Next, the blind via machining was carried out on the copper-clad laminate on which the blackening treatment was carried out by the $CO_2$ laser in the same manner with the first embodiment.

3) Alkali Treatment:

Next, the alkali treatment was carried out in the same manner with the first embodiment in order to remove the adherent substance derived from the insulating layer and that is generated on the via wall face during laser machining.

4) Molten and Scattered Cu Etching Treatment:

Next, the etching was carried out in order to remove the molten and scattered Cu and overhang. The etching solution contained 100 g/l of cupric chloride and the treatment was carried out under the condition of 30° C. of solution temperature. However, the copper oxide film resolved soon after soaking into the etching solution.

From this result, it was found that because the cupric chloride solution easily resolves the copper oxide, it is not suitable as the molten and scattered Cu etching solution. Accordingly, the molten and scattered Cu etching solution must be what by which the copper oxide film is resolved less.

Third Comparative Example

The similar multi-layered printed wiring board with that of the first embodiment was fabricated by changing the sequence of the direct via machining process, i.e., by carrying out the molten and scattered Cu etching treatment after the oxide film removing treatment and the de-smearing treatment for comparison.

1) Copper Foil Surface Oxidation Treatment:

The blackening treatment was carried out in the same manner with the first embodiment in order to roughen the outer-layer copper foil surface of the copper-clad laminate and to form the copper oxide film.

2) Laser Via Machining:

Next, the blind via machining was carried out on the copper-clad laminate on which the blackening treatment was carried out by the $CO_2$ laser under the similar condition with the first embodiment.

3) Copper Oxide Film Removing Treatment:

Next, the etching was carried out in order to remove the copper oxide film on the outer-layer copper foil. The etching solution contained 200 g/l of ammonium persulfate and 5 ml/l of sulfuric acid. The treatment condition was 30° C. of solution temperature and one minute of treatment time.

4) De-Smearing Treatment:

Next, the de-smearing treatment was carried out under the same condition with the first embodiment in order to remove resin residue at the bottom of the via.

5) Molten and Scattered Cu Etching Treatment:

Next, the etching was carried out under the same condition with the first embodiment in order to remove the molten and scattered Cu and overhang.

A section of the fabricated printed wiring board was observed in the same manner with the first embodiment for the measurement of the state of the removal of the molten and scattered Cu and overhang and of the etching width of the outer-layer copper foil and for the detection of the reduced width of the thickness of the outer-layer copper foil and the inner-layer wiring. The sample was taken after the de-smearing treatment after the laser via machining in the direct via machining process. FIG. 4 shows its result.

The molten and scattered Cu and overhang were all removed after the de-smearing treatment and the measured result of the etching width of the outer-layer copper foil was 3 μm. However, in the evaluation of the reduced width of the thickness of the outer-layer copper foil, the thickness decreased by 2.5 μm after the molten and scattered Cu etching as compared to that after the laser via machining. In the evaluation of the reduced width of the thickness of the inner-layer wiring, the thickness decreased by 2.1 μm after the molten and scattered Cu etching as compared to that after the laser via machining. Thus, the thickness of the outer-layer copper foil and the inner-layer wiring decreased significantly when the molten and scattered Cu etching was carried out after the oxide film removing treatment and the de-smearing treatment.

The need for the alkali treatment, the selectivity of the molten and scattered Cu etching solution and the importance of the processing sequence in the direct via machining process of the invention were confirmed from the results of these first through third comparative examples.

Next, the copper foil surface treatment (oxide film forming) step in FIG. 2a will be explained. Conventionally, a method of providing a different type of layer such as a metal layer and an organic film on a surface of copper foil has required lamination of the different layer and peeling thereof after machining a via, thus requiring a significant increase of a number of steps. Still more, because the blackening treatment for roughening the surface of the copper foil is originally a copper foil surface treatment for closely adhering an inner-layer wiring with an insulating layer, reflectance of the surface reflecting the laser light is as high as 90% or more. Accordingly, high laser energy is necessary in order to drill the blackened copper foil. Due to that, the overhang is produced during machining, dropping the dimensional accuracy of the bore.

While the commercially sold treatment solution has been used above in order to form the oxide film on the surface of the copper foil, its effect may be improved further by arranging as described below.

In the copper foil surface treatment of the present embodiment, a copper oxide film whose surface reflectance is 30 to 80%, or more desirably 30 to 55%, when the wavelength of laser is in a range from 9.3 to 10.6 μm and whose thickness is 1.0 to 2.0 μm is formed on the surface of copper foil located in the outer layer. This copper oxide is formed by a treatment solution containing sodium chlorite of 100 to 160 g/l of concentration and sodium hydroxide of 60 to 100 g/l of concentration. It allows the copper foil to be machined at low energy.

Still more, the copper foil surface treatment for forming the copper oxide whose surface reflectance to infrared light whose wavelength is in a range of 9.3 to 10.6 μm is 30 to 80% and whose thickness is 1.0 to 2.0 μm is carried out on the surface of the outer-layer copper foil of the laminate fabricated by cladding the copper foil on a base material resin and used in the manufacturing method of the printed wiring board before the laser machining of forming a via by means of laser light whose wavelength is in a range of 9.3 to 10.6 μm.

The laser apparatus used in the manufacturing method of the printed wiring board is $CO_2$ laser whose laser light is infrared light whose wavelength is preferably 9.3 to 10.6 μm.

Twelfth Through 23$^{rd}$ Embodiments

Copper-clad laminate MCL-E679 in which the copper foil is laminated on glass-cloth containing epoxy resin, manufactured by Hitachi Chemical Co., Ltd. was used in the first through twelfth embodiments. A thickness of the copper foil was 18 μm. The copper foil surface treatment was carried at first on this copper-clad laminate.

Figure 7:
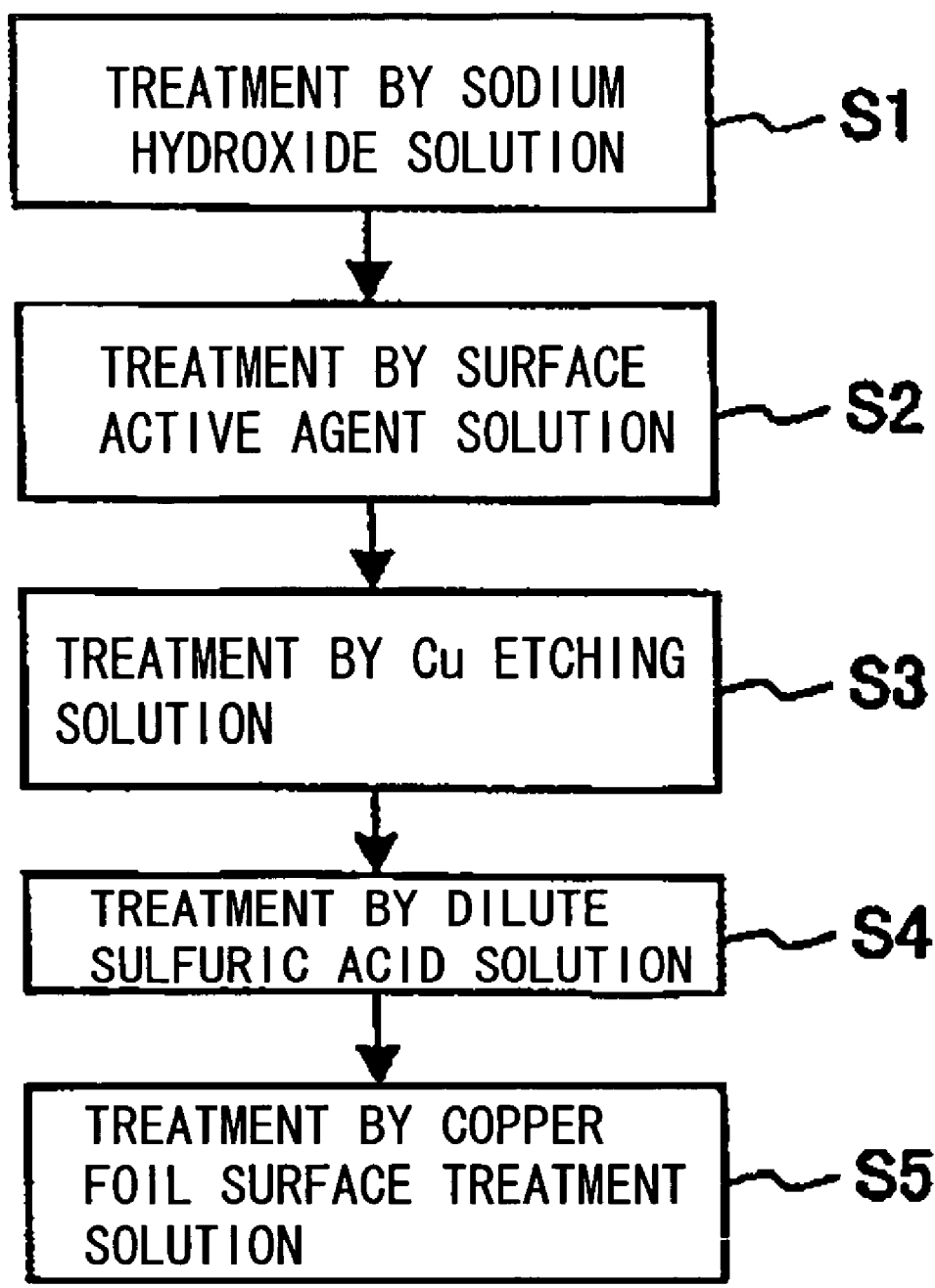
FIG. 7 is a flowchart showing copper foil surface treatment steps of the invention.

FIG. 7 is a flowchart showing steps of the copper foil surface treatment. At first, a degreasing treatment was carried out by a sodium hydroxide solution at 50° C. of solution temperature for three minutes of treatment time to clean the surface of the copper foil of the copper-clad laminate and then rinsing by water was carried out in Step S1. Next, a conditioner treatment was carried out by a surface active agent solution at 40° C. of solution temperature for three minutes of treatment time and then rinsing was carried out by water in Step S2. In Step S3, the treatment was carried out by a Cu etching solution of ammonium persulfate at 40° C. of solution temperature for three minutes of treatment time and then rinsing was carried out by water. In Step S4, the treatment was carried out by a dilute sulfuric acid solution of 5% of concentration at 25° C. of solution temperature for one minute of treatment time and then rinsing was carried out by water. Finally in Step S5, the treatment was carried out by a copper foil surface treatment solution containing sodium chlorite of 100 to 160 g/l of concentration and sodium hydroxide of 60 to 100 g/l of concentration at 70° C. of solution temperature for seven minutes of treatment time and then the copper foil was dried after rinsing by water. It is noted that although the solution temperature of the copper foil surface treatment solution has been 70° C. in the 12$^{th}$ to 23$^{rd}$ embodiments, it is possible to assure the predetermined surface shape and film thickness by carrying out the copper foil surface treatment in a range of 60 to 90° C. of solution temperature.

FIG. 8 is a table showing exemplary concentrations of the copper foil surface treatment solution in Step S5. The concentration of sodium chlorite was 100 to 160 g/l and the concentration of sodium hydroxide was 60 to 100 g/l.

The via machining was carried out by the $CO_2$ laser by using the copper-clad laminate on which the copper foil surface treatment has been carried out for evaluation of the machinability. Targets bores were 50 μm and 80 μm. FIG. 9 shows the results. The evaluation of machinability is performed by measuring energy required for the via machining. The laser energy was varied from 1.1 mJ to 25.2 mJ in one shot machining as a machining condition. The laser energy when the copper foil of 18 μm in thickness reached to the target bore was measured. This value represents laser energy required in the via machining.

It is noted that the surface reflectance and thickness of the copper oxide formed by the copper foil surface treatment were also measured as shown in FIG. 9.

The measurement of the surface reflectance of the copper oxide was carried out by a highly sensitive reflecting method of an infrared absorption spectroscopy with 80 degrees of incident angle. The measured wavelength was in the range of 9.3 to 10.6 μm similarly to the $CO_2$ laser. An electro-chemical reduced potential method was used for the measurement of the thickness of the copper oxide. The measurement was carried out by using an electrode area of $4.5 \times 10^{-2}$ cm$^2$, an electrolytic solution of 0.1 mol/l NaOH aqueous solution, a reference electrode of saturated KCl silver/silver chloride electrode and 1 mA of current value.

According to the present embodiment, the insulating layer under the copper foil is removed more than the copper foil because the laser via machining is carried out directly on the copper foil on which the copper foil surface treatment has been carried out. Therefore, a so-called overhang by which the bore of the insulating layer becomes larger than that of the outer-layer copper foil occurs. In order to evaluate the overhang, a section of the copper-clad laminate after the laser machining was polished and a ratio of the bore of the outer-layer copper foil to the bore of the insulating layer was measured by observing the section. FIG. 10 shows its result.

Fourth Comparative Example

In a fourth comparative example, the blackening treatment of the conventional art was carried out by using the copper-clad laminate MCL-E679 similarly to the 12$^{th}$ to 23$^{rd}$ embodiments. The blackening treatment may be compared with the copper foil surface treatment of the present embodiment as follows. While the blackening treatment is the same with the copper foil surface treatment of the present embodiment until Steps S1 through S4 in FIG. 7, the concentration of sodium chlorite was 90 g/l and the concentration of sodium hydroxide was 15 g/l in the treatment in Step S5 as shown in FIG. 8. After thus carrying out the blackening treatment, the evaluation of laser via machinability, the measurement of the copper oxide, the measurement of thickness of the film and the evaluation of the overhang were carried out in the same manner with the 12$^{th}$ to 23$^{rd}$ embodiments. FIG. 9 shows the results of the evaluation of laser via machinability, the measurement of the copper oxide and the measurement of thickness of the film and FIG. 10 shows the result of the evaluation of the overhang

Fifth Comparative Example

In a fifth comparative example, copper-clad laminate MCL-E679 was used similarly to the 12$^{th}$ through 23$^{rd}$ embodiments. However, the copper foil surface treatment is different from the cases of the first through 12$^{th}$ embodiments. In the fifth comparative example, the treatment of the copper-clad laminate MCL-E679 was carried out by a cleaning solution (MB-115, concentration 100 ml/l) at first at 50° C. of solution temperature and for three minutes of treatment time at first and then rinsing was carried out by water. Next, it was treated by a pre-dip solution (MB-100B, concentration: 20 ml/l) and MB-100C, concentration 29 ml/l) at 25° C. of solution temperature and for one minute of treatment time and was then treated by a multi-bond solution (MB-100A, concentration: 100 ml/l, MB-100B, concentration: 80 ml/l, MB-100C, concentration 43 ml/l, sulfuric acid, concentration: 50 ml/l) at 32° C. of solution temperature and for two minutes of treatment time. It was then rinsed by water and was dried. The multi-bond solution was a copper roughening etching solution of sulfuric acid/hydrogen peroxide manufactured by Japan MacDermid Co.

Next, the results of evaluation of the laser via machinability will be discussed with respect to the 12$^{th}$ through 23$^{rd}$ embodiments and the fourth and fifth comparative examples with reference to FIGS. 9 and 10. The good via machinability means that less energy is required for the via machining. The low surface reflectance also means that a percentage of energy utilized for the laser machining is high. Accordingly, the low surface reflectance may also imply that the via machinability is good.

Comparing the 12$^{th}$ through 23$^{rd}$ embodiments with the fourth comparative example, it may be confirmed that the laser machining energy of all of the 12$^{th}$ through 23$^{rd}$ embodiments is smaller than that of the fourth comparative example and hence their via machinability is good.

Figure 11:
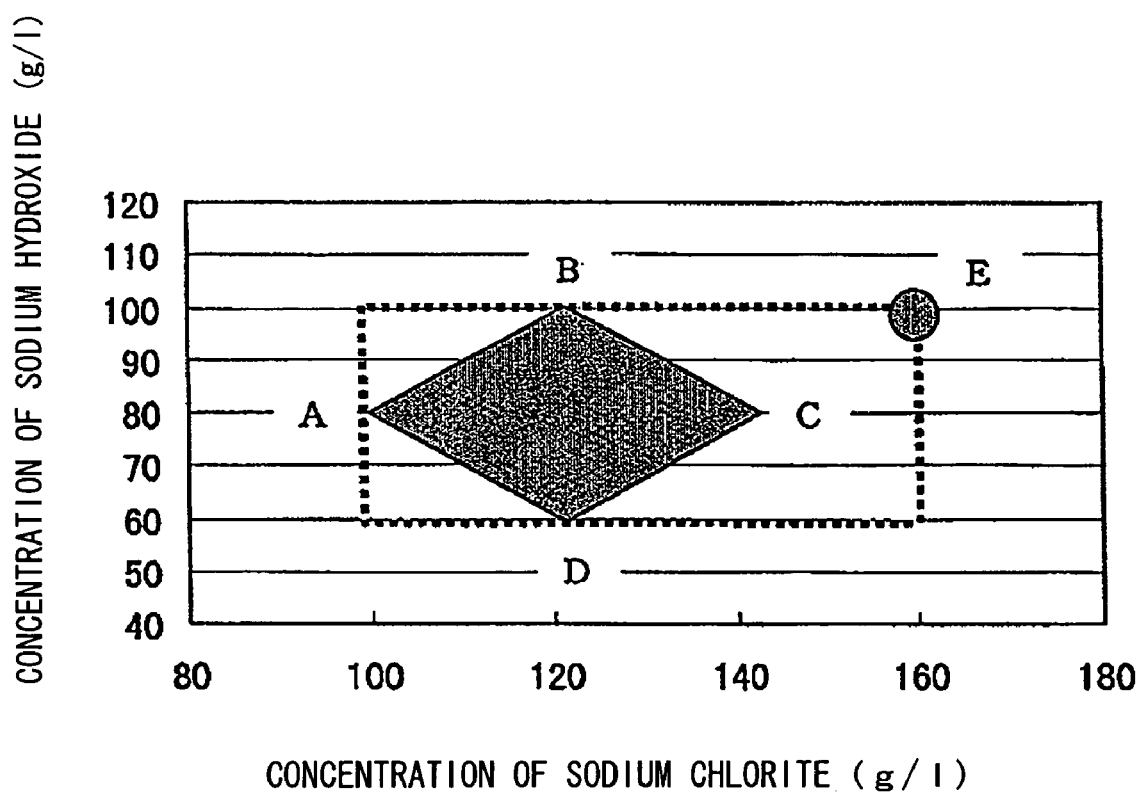
FIG. 11 is a graph showing an optimum concentration range of the copper foil surface treatment solution of the invention.

FIG. 11 is a graph showing a range of the concentration of sodium chlorite used in the present embodiment of 100 to 160 g/l and that of the concentration of sodium hydroxide of 60 to 100 g/l. Their concentration of the 12$^{th}$ through 23$^{rd}$ embodiments fall within a rectangular range presented by a broken line. Accordingly, the laser machining energy is smaller than that of the fourth comparative example within the rectangular range presented by the broken line and hence the via machinability is good. The surface reflectance is about 30 to 80% within this range. That is, the surface reflectance is about 30 to 65% except of the 17$^{th}$ and 20$^{th}$ embodiments.

The embodiments in which the machinability was specifically good were the 12$^{th}$ embodiment, 13$^{th}$ embodiment, 14$^{th}$ embodiment, 16$^{th}$ embodiment, 19$^{th}$ embodiment and 21$^{st}$ embodiment. The concentrations of those embodiments fall within a slant-lined diamond region surrounded by points A through D shown in FIG. 11 and in a region in the vicinity of point E. In this regions, the laser machining energy is small and the surface reflectance is about 30 to 55%. Above all, the 12$^{th}$ embodiment obtained the best result.

The fourth comparative example will now be discussed. Comparing the fourth comparative example with the 12$^{th}$ embodiment, the fourth comparative example required about four times of laser energy as compared to the 12$^{th}$ embodiment in the evaluation of the laser via machinability when the target bore was 50 μm. In the result of evaluation of the overhang, the bore of the copper foil has become a half of the bore of the insulating layer and it was found that the overhang was larger than that of the first embodiment. It may be considered to have happened because the reduction of the laser energy has reduced a difference of removed amounts of the copper foil and the insulating layer.

The reflectance of the copper oxide in the fourth comparative example is as high as 98%, which is about three times as compared to that of the 12$^{th}$ embodiment. The thickness of the copper oxide was 0.5 μm and was thin by 2.8 times as compared to that of the 12$^{th}$ embodiment. Still more, while the shape of crystal of the formed copper oxide of the fourth comparative example was fine needle-like crystal, the crystal of the 12$^{th}$ embodiment was concavo-convex crystal and the size of one crystal was also large as compared to that of the fourth comparative example. It was confirmed from these results that the copper foil surface treatment of the invention allows the reduction of the laser machining energy and the reduction of the overhang.

Next, the fifth comparative example will be discussed. The surface reflectance of the fifth comparative example was 50% and the thickness of the copper oxide was 0.02 μm. The copper foil surface treatment solution of the fifth comparative example is characterized in that it forms almost no copper oxide on the surface of the copper foil.

The fifth comparative example will be compared with the 13$^{th}$ and 21$^{st}$ embodiments. Although the surface reflectance of the both is about the same, the thickness of the copper oxide of the 13$^{th}$ and 21$^{st}$ embodiments is thicker than that of the fifth comparative example. However, the laser energy is high in the fifth comparative example in the evaluation of the laser via machinability of the target bore of 50 μm. Although its cause is unknown, it is presumed that the formation of the copper oxide on the surface of the copper foil prevents thermal energy of the laser from diffusing into the atmosphere and improves the machining efficiency by the thermal energy. Thermal conductivity of copper oxide is 0.003 gJ/cm·s·K as compared to thermal conductivity of copper of 4.01 gJ/cm·s·K and is smaller by 1/100.

Although it was confirmed from these results that the thicker the copper oxide, the more the laser via machinability improves, the thickness of the copper oxide is desirable to be 1.0 to 2.0 μm because of the problems that the copper oxide must be removed after machining the via and that the thickness of the copper foil is reduced.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A method of manufacturing a printed wiring board by machining a via by means of a laser directly through a copper foil of a copper-clad laminate in which the copper foil is clad on a base material resin, wherein machining said via is carried out by a process, in the following sequence, comprising:

forming a copper oxide film on a surface of an outer layer copper foil pasted on an outer layer of said base material resin;

laser machining to form the via through the outer-layer copper foil and base material resin, wherein an adherent substance derived from the base material resin is adhered to molten and scattered copper formed during the laser machining around an opening of the via;

removing the adherent substance with an alkali aqueous solution to expose the molten and scattered copper while leaving a resin smear on the bottom of the via covering an inner-layer wiring;

etching to selectively remove the molten and scattered copper with an etching solution containing member selected from the group consisting of (1) ammonium persulfate, (2) sodium persulfate, (3) ferric chloride, (4) ammonia and hydrogen peroxide and (5) ammonia and copper chloride, while leaving the resin smear on the bottom of the via and the copper oxide film on the outer-layer copper foil; and removing the resin smear on the bottom of the via by a de-smearing process after etching the molten and scattered copper.

2. The method as set forth in claim 1, wherein said alkali aqueous solution is a treatment solution containing sodium hydroxide or potassium hydroxide.

3. The method as set forth in claim 1, wherein the copper oxide film formed on the outer-layer copper foil has a reflectance of 30 to 80% to infrared light having a wavelength in a range of 9.3 to 10.6 μm and a thickness of 1.0 to 2.0 μm.

4. The method as set forth in claim 1, wherein the surface of the outer-layer copper foil is treated with a surface treatment solution containing sodium chlorite having a concentration of 100 to 160 (g/l) and sodium hydroxide having a concentration of 60 to 100 (g/l) to form the copper oxide film.

5. The method as set forth in claim 1, wherein the de-smearing process removes the copper oxide film of the outer-layer copper foil, and comprises:

removing the resin smear on the bottom of the via by a treatment solution containing an oxidant; and neutralizing the treatment solution containing the oxidant with a neutralizing solution.

6. A method of manufacturing a printed wiring board by machining a via by means of a laser directly through a copper foil of a copper-clad laminate in which the copper foil is clad on a base material resin, wherein machining said via is carried out by a process, in the following sequence, comprising:

forming a copper oxide film on a surface of an outer-layer copper foil pasted on an outer layer of said base material resin;

laser machining to form the via through the outer-layer copper foil and the base material resin, wherein an adherent substance derived from the base material resin is adhered to a molten and scattered copper formed during the laser machining around an opening of the via;

removing the adherent substance with an alkali aqueous solution to expose the molten and scattered copper;

etching the molten and scattered copper with an etching solution, under the condition that the outer-layer copper foil is covered by the copper oxide film, wherein the solubility of the etching solution to copper oxide is small as compared the solubility to copper; and removing the copper oxide film on the surface of the outer-layer copper foil after etching the molten and scattered copper.

7. The method as set forth in claim 6, further comprising plating the via after removing the copper oxide film on the surface of the outer-layer copper foil.

* * * * *